(12) United States Patent
Yamamoto et al.

(10) Patent No.: US 6,638,392 B2
(45) Date of Patent: Oct. 28, 2003

(54) PLASMA PROCESS APPARATUS

(75) Inventors: Naoko Yamamoto, Osaka (JP);
Takamitsu Tadera, Tenri (JP); Tatsushi Yamamoto, Ikoma-gun (JP); Masaki Hirayama, Sendai (JP); Tadahiro Ohmi, 2-1-17-301, Komegafukuro, Aoba-ku, Sendai-shi, Miyagi (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 0 days.

(21) Appl. No.: 09/730,739

(22) Filed: Dec. 7, 2000

(65) Prior Publication Data

US 2001/0010207 A1 Aug. 2, 2001

(30) Foreign Application Priority Data

Dec. 7, 1999 (JP) ............................................. 11-347550

(51) Int. Cl.[7] ........................... H05H 1/00; C23C 16/00
(52) U.S. Cl. ............................. 156/345.41; 156/345.33; 118/723 MW
(58) Field of Search ..................... 156/345.41, 345.33, 156/345.34, 345.42, 345.48, 345.47, 345.43; 118/723 MW, 723 E, 723 I, 715

(56) References Cited

U.S. PATENT DOCUMENTS

| | | | | |
|---|---|---|---|---|
| 5,053,678 A | * | 10/1991 | Koike et al. ............. 315/111.81 |
| 5,107,170 A | * | 4/1992 | Ishikawa et al. ......... 313/362.1 |
| 5,133,825 A | * | 7/1992 | Hakamata et al. .......... 156/345 |
| 5,134,965 A | * | 8/1992 | Tokuda et al. ...... 118/723 MW |
| 5,391,260 A | * | 2/1995 | Makino et al. ................ 216/69 |
| 5,620,522 A | * | 4/1997 | Ichimura et al. ..... 118/723 MR |
| 5,645,644 A | * | 7/1997 | Mabuchi et al. .... 118/723 MW |
| 5,900,065 A | * | 5/1999 | Liehr et al. ........... 118/723 HC |
| 5,985,378 A | * | 11/1999 | Paquet ........................ 427/562 |
| 6,165,311 A | * | 12/2000 | Collins et al. .............. 156/345 |
| 6,244,211 B1 | * | 6/2001 | Nishikawa et al. ... 118/723 AN |
| 6,269,765 B1 | * | 8/2001 | Chu et al. .................. 118/723 I |
| 6,286,454 B1 | * | 9/2001 | Hirayama et al. .. 118/723 MW |
| 6,332,947 B1 | * | 12/2001 | Ichimura et al. ............ 156/345 |
| 6,338,313 B1 | * | 1/2002 | Chan ....................... 118/723 I |

FOREIGN PATENT DOCUMENTS

| | | | | |
|---|---|---|---|---|
| JP | 06061153 A | | 3/1994 | |
| JP | a7335633 | | 12/1995 | |
| JP | B2-2669168 | | 7/1997 | |
| JP | 2001-122690 A | * | 5/2001 | ........... C23C/25/02 |

* cited by examiner

*Primary Examiner*—Parviz Hassanzadeh
(74) *Attorney, Agent, or Firm*—Birch, Stewart, Kolasch & Birch, LLP

(57) ABSTRACT

A plasma process apparatus includes a dielectric plate to emit plasma inside a chamber, and dielectric plate support members to support a dielectric plate. A plurality of gas introduction holes to supply reaction gas to the chamber interior are provided at the dielectric plate support members. The outlet of the gas introduction hole is open at the side facing the surface of substrate 8, and arranged at a peripheral region outer than dielectric plate 5. Ground potential is applied to a chamber lid and the dielectric plate support members, and bias voltage is applied to the substrate. Accordingly, a low-cost plasma process apparatus that can process uniformly a substrate of a large area using uniform plasma can be obtained.

7 Claims, 9 Drawing Sheets

PLASMA PROCESS APPARATUS

BACKGROUND OF THE INVENTION

1. Field of the Invention

The present invention relates to plasma process apparatuses, particularly to a plasma process apparatus such as an etching apparatus, CVD (Chemical Vapor Deposition) apparatus and ashing apparatus used in the fabrication process of semiconductors, liquid crystal display elements, solar cells, and the like.

2. Description of the Background Art

FIG. 6 is a schematic sectional view of a conventional plasma process apparatus formed as, for example, an ashing apparatus. Referring to FIG. 6, this plasma process apparatus includes an upper lid 101, a chamber unit 102, a substrate holder 107, a dielectric-covered channel 113, and a shield plate 114.

Upper lid 101 is formed of a dielectric such as alumina, arranged on chamber unit 102. A gasket (not shown) is provided between upper lid 101 and chamber unit 102 for sealing thereof, whereby process chamber 112 is isolated from the atmosphere. Process chamber 112 is maintained in vacuum by using a vacuum pump or the like in advance.

Substrate holder 107 to hold a substrate 108 is provided in process chamber 112. The surface of substrate 108 placed on substrate holder 107 faces upper lid 101. A gas introduction tube 111 is provided at the wall of chamber unit 102. Raw material gas is supplied into process chamber 112 through gas introduction tube 111.

Dielectric-covered channel 113 is provided above upper lid 101. The top and outer perimeter of dielectric-covered channel 113 is surrounded by shield plate 114. A microwave guide (not shown) is connected to dielectric-covered channel 113.

In the ashing process using this conventional plasma process apparatus, predetermined material gas is supplied through gas introduction tube 111 into process chamber 112. Microwave is introduced into process chamber 112 from upper lid 101 through dielectric-covered channel 113. Plasma is exited in process chamber 112, whereby the resist at the surface of substrate 108 is subjected to ashing.

In the aforementioned conventional plasma process apparatus, raw material gas is introduced from only one gas introduction tube 111. Distribution of the raw material gas supplied into process chamber 112 is generated. Therefore, it was difficult to effect an ashing process uniformly.

The technique to solve this problem is disclosed in, for example, Japanese Patent No. 2669168 and Japanese Patent Laying-Open No. 7-335633.

FIG. 7 is a schematic sectional view of the plasma process apparatus disclosed in Japanese Patent No. 2669168. Referring to FIG. 7, this plasma process apparatus differs in structure from the plasma process apparatus of FIG. 6 in that a showerhead 115 is provided and a plurality of gas introduction tubes 111 are connected symmetrically.

Showerhead 115 is located above substrate holder 107 and in the proximity of the bottom plane of upper lid 101 so as to cover the entire area of substrate 108. Showerhead 115 includes a plurality of holes 115a. The outer peripheral portion of showerhead 115 is L-shaped in cross section. A buffer chamber 115b is formed by this portion. The termination end of showerhead 115 is fixedly connected to the inner wall of chamber unit 102.

The remaining structure is similar to that of FIG. 6. The same components have the same reference characters allotted, and description thereof will not be repeated.

In the operation of this apparatus, substrate 108 is placed on substrate holder 107, followed by setting the interior of process chamber 112 to a predetermined level of vacuum. Then, predetermined gas is admitted into buffer chamber 115b through a plurality of gas introduction tubes 111. The gas is introduced into process chamber 112 via hole 115a of showerhead 115 from buffer chamber 115b. Then, the microwave from a microwave guide is introduced into process chamber 112 from upper lid 101 through dielectric-covered channel 113. Accordingly, plasma is generated by microwave excitation in process chamber 112, whereby the resist at the surface of substrate 108 is subjected to ashing.

FIG. 8 is a schematic sectional view of a plasma process apparatus disclosed in Japanese Patent Laying-Open No. 7-335633. Referring to FIG. 8, this plasma process apparatus differs in structure from that of FIG. 6 in the addition of a metal plate 116.

Metal plate 116 is arranged in contact with the bottom plane of upper lid 101. As shown in FIG. 9, metal plate 116 includes a microwave passage opening 116c in the form of a slit, a plurality of holes 116a formed at the substrate holder side plane, and a gas supply opening 116d provided at the side plane. Gas introduction tube 111 is connected to gas supply opening 116d. Metal plate 116 is hollow, so that gas supply opening 116d communicates with plurality of holes 116a inside. Upon supply of reaction gas from gas supply opening 116d, the reaction gas is blown out into process chamber 112 through the plurality of holes 116a.

The remaining structure is similar to that of the plasma process apparatus of FIG. 6. The same components have the same reference characters allotted, and description thereof will not be repeated.

In the operation of this apparatus, the interior of process chamber 112 is set to a predetermined level of vacuum after substrate 108 is placed on substrate holder 107. Then, predetermined gas is introduced from gas introduction tube 111 into metal plate 116 through gas supply opening 116d. Gas blows out from the plurality of holes 116a of metal plate 116 to enter process chamber 112. Microwave is introduced into process chamber 112 from a microwave passage opening 116c of metal plate 116 through dielectric-covered channel 113 and upper lid 101. Accordingly, plasma is generated in process chamber 112, whereby the resist at the surface of substrate 108 is subjected to ashing.

Recently, increase in the size of substrates is notable in the field of IC (Integrated Circuit) and liquid crystal. Particularly in the case of a TFT (Thin Film Transistor) liquid crystal display, the size of the substrate is as large as 500 mm square to 1 m square, or more. When these large substrates are to be subjected to a plasma process in apparatuses disclosed in Japanese Patent No. 2669168 and Japanese Patent Laying-Open No. 7-335633, problems set forth in the following are encountered.

In accordance with a larger substrate 108, dielectric-covered channel 113, upper lid 101, showerhead 115 or metal plate 116 must also be increased in size so that the entirety of the large substrate 108 is covered. However, it is difficult to produce a large upper lid 101 since upper lid 101 is formed of a dielectric such as ceramics. Also, the cost will be increased. Furthermore, since upper lid 101 functions as a partition wall from the atmosphere, the thickness of upper lid 101 must be increased corresponding to the larger area in order to withstand the atmosphere while maintaining the interior of process chamber 112 in vacuum. However, it is difficult to form an upper lid 101 of a large size. The same applies for dielectric-covered channel 113.

In the case where showerhead 115 of Japanese Patent No. 2669168 is formed of metal, the attachment of the reaction by-product on showerhead 115 will alter the plasma discharge characteristic. Also, since showerhead 115 is exposed to plasma, showerhead 115 will be increased in temperature by the heat generated from the plasma to cause thermal expansion. If showerhead 115 is formed of ceramic alone to avoid this problem, the size for process will be limited. Also, the cost of showerhead 115 will increase.

A larger substrate 108 also induces the problem that generation of uniform plasma becomes difficult. This is because the flow (conductance) of the reaction gas at gas introduction hole 115a differs between the outer circumferential side and inner circumferential side of showerhead 115 even if buffer chamber 115b is provided.

Similarly, the flow (conductance) of the reaction gas at the gas introduction hole 116a differs between the outer circumferential side and the inner circumferential side for metal plate 116 of Japanese Patent Laying-Open No. 7-335633 when substrate 108 is increased in size. It is therefore difficult to produce plasma uniformly.

Also, the complicated shape of metal plate 116 will render the fabrication process difficult to increase the cost.

In the case of metal plate 116, the microwave is introduced through slit-shaped microwave passage opening 116c. The location where the generated plasma establishes a uniform state differs depending upon the width and interval of the slit of microwave openings 116c and the thickness of metal plate 116. Uniform plasma will be established at an area remote from upper lid 101 as metal plate 116 becomes thicker.

SUMMARY OF THE INVENTION

In view of the foregoing, an object of the present invention is to provide a low cost plasma process apparatus that can process uniformly a substrate of a large area using uniform plasma.

According to an aspect of the present invention, a plasma process apparatus applies a plasma process on the surface of a substrate using reaction gas set to a plasma state by microwaves. The plasma process apparatus includes a processing chamber, a microwave transmission member, a plurality of dielectric plates, and a plurality of reaction gas supply paths. The processing chamber can support a substrate inside. The microwave transmission member transmits microwaves. The plurality of dielectric plates have a main surface facing the surface of the substrate, and directs the microwaves transmitted by the microwave transmission member from the main surface into the processing chamber. The plurality of reaction gas supply paths supply reaction gas to the processing chamber. Each of the plurality of reaction gas supply paths includes a reaction gas outlet open at the side facing the surface of the substrate. A plurality of reaction gas blow outlets are arranged at a peripheral region outer than the edge of the main surface of the dielectric plate. A structure is provided in which ground potential is applied to the processing chamber and bias voltage is applied to the substrate (first aspect of invention).

By setting the processing chamber at the ground potential and the substrate at the bias voltage in the plasma process apparatus of the present invention, ions, excited particles, electrons and the like in the plasma can be driven incident on the entire surface of the substrate substantially perpendicularly (bias effect). In other words, the directivity of the ions and the like in the plasma process can be controlled favorably.

The dielectric plate is divided into a plurality of portions. It is therefore not necessary to use one large dielectric plate even in the case where a substrate of a large area is to be processed. Fabrication of the dielectric plate of the present invention is not rendered difficult.

The division of the dielectric plate into a plurality of portions allows a dielectric plate of uniform material to be easily obtained using existing fabrication facilities in comparison to the case where one large dielectric plate is produced.

Also, the usage of a plurality of dielectric plates allows the damage, if any, of a portion of the dielectric plate to be easily and promptly be repaired by simply replacing the damaged dielectric plate. Therefore, the labor and time required for the maintenance of the plasma process apparatus can be reduced.

The plasma process apparatus is configured so that reaction gas is supplied from the surroundings of each divided dielectric plates. Therefore, reaction gas can be supplied evenly from the surroundings of the dielectric plate even when a substrate of a large area is processed. Thus, uniform plasma can be realized.

The showerhead and metal plate in the conventional apparatuses are no longer necessary since uniform plasma can be realized.

In the plasma process apparatus of the present invention, the area of the metal portion at the inner wall of the processing chamber facing the surface of the substrate is at least 50% (second aspect of invention).

In general, the dielectric plate attains a floating potential since it functions as the microwave transmission path. When the area of the dielectric plate at the plane facing the surface of the substrate is greater than the area of the metal portion, the aforementioned bias effect cannot be achieved sufficiently.

In the present invention, the aforementioned bias effect can be exhibited sufficiently since the area of the metal portion at the plane facing the surface of the substrate is at least 50%. The ion directivity is superior in the plasma process. Thus, a favorable plasma process can be carried out.

In the plasma process apparatus of the present invention, an outlet for the dielectric plate communicating with the reaction gas supply path is provided at the dielectric plate (third aspect of invention). gas can be supplied in a more uniform manner into the processing chamber.

In the plasma process apparatus of the present invention, in the region sandwiched between one dielectric plate and the other dielectric plate adjacent to each other among the plurality of dielectric plates a plurality of reaction gas outlets are arranged along the direction from one dielectric plate to the other dielectric plate (fourth aspect of invention).

Accordingly, reaction gas can be supplied in a more uniform manner into the processing chamber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
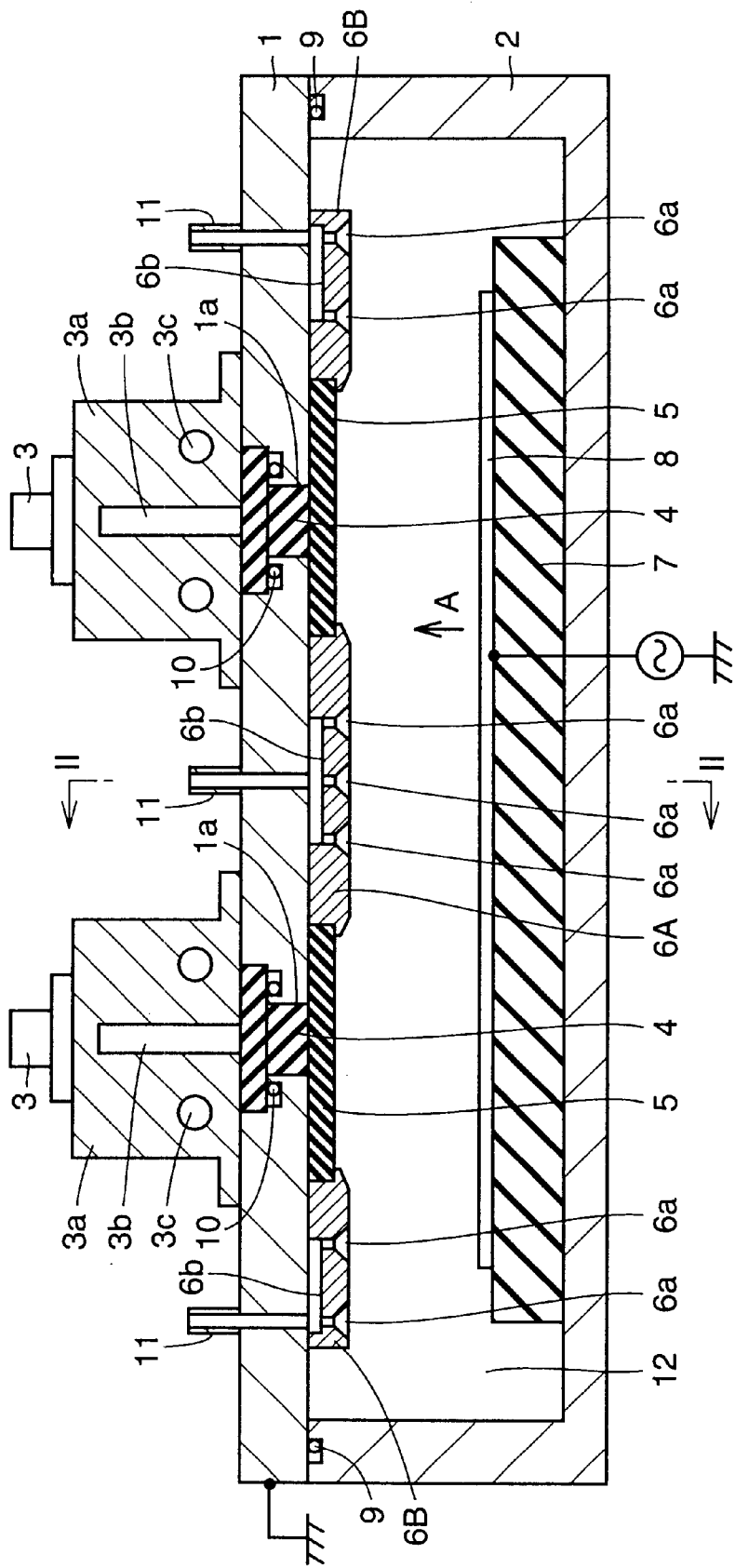
FIG. 1 is a schematic sectional view of a plasma process apparatus according to a first embodiment of the present invention.
Figure 2:
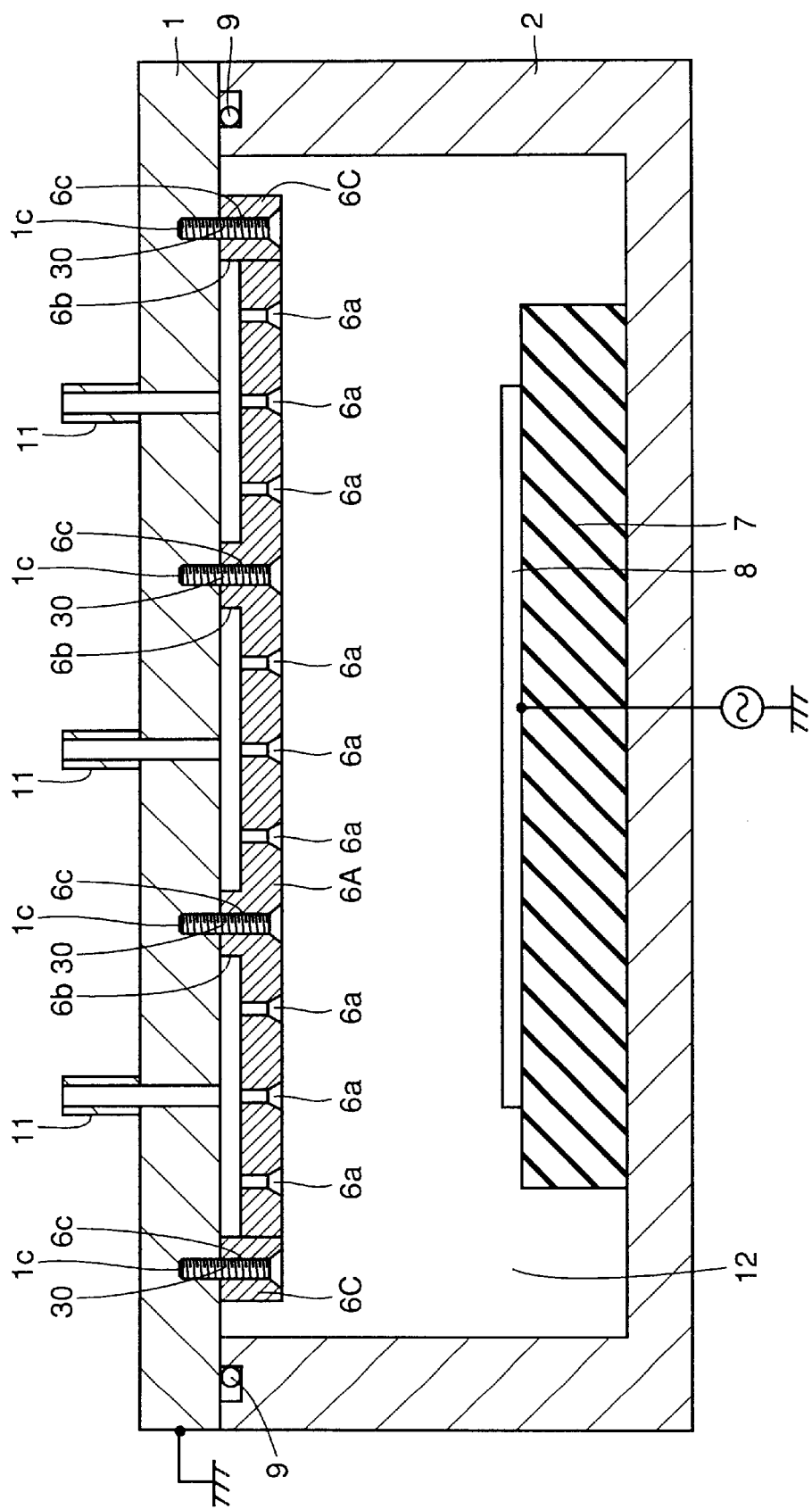
FIG. 2 is a schematic sectional view taken along line II—II of FIG. 1.
Figure 3:
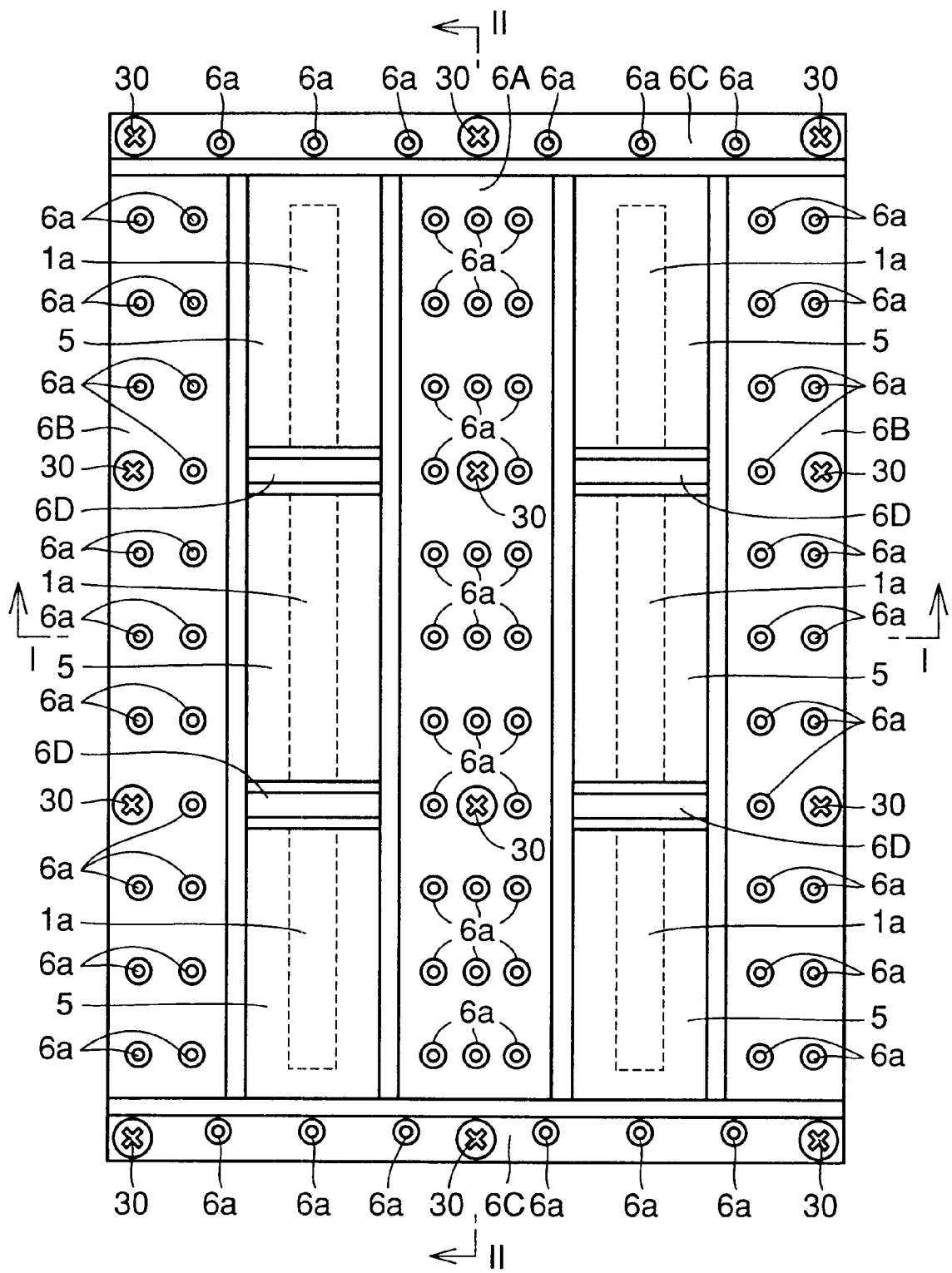
FIG. 3 shows an arrangement of dielectric plates and dielectric plate support members viewed from the direction of arrow A of FIG. 1.

FIG. 1 corresponds to the cross section taken along line I—I of FIG. 3, and FIG. 2 corresponds to the cross section taken along line II—II of FIG. 3.

Referring mainly to FIG. 1, a plasma process apparatus according to a first embodiment of the present invention includes a chamber lid 1, a process chamber unit 2, a waveguide 3, a waveguide end 3a, a microwave introduction window 4, a dielectric plate 5, dielectric plate support members 6A–6D, and a substrate holder 7.

Chamber lid 1 is arranged at the upper end of process chamber unit 2. A gasket 9 is provided between chamber lid 1 and process chamber unit 2 to achieve sealing. An opening 1a in the shape of a slid is formed at chamber lid 1. Microwave introduction window 4 formed of a dielectric such as $SiO_2$, $Al_2O_3$, AlN, and having a cross section of a T shape is inserted at opening 1a. The space between chamber lid 1 and microwave introduction window 4 is sealed by a gasket 10. The hermetic seal of chamber interior 12 is maintained by gasket 10 and gasket 9. Chamber interior 12 is exhausted by a vacuum pump (not shown) to maintain a vacuum state.

A waveguide end 3a is located at the atmosphere side of microwave introduction window 4. Waveguide end 3a is connected to waveguide 3 at the top center region. The microwave guided from waveguide 3 is emitted towards microwave introduction window 4 from an opening 3b. A temperature retain channel 3c is provided at waveguide end 3a. A temperature retain medium such as water is conducted through temperature retain channel 3c so as to maintain waveguide end 3a and surrounding regions at a predetermined temperature.

At the vacuum side of chamber lid 1 are provided six, for example, dielectric plates 5 formed of a dielectric such as $SiO_2$, $Al_2O_3$, and AlN. At the outer peripheral portion of dielectric plates 5, dielectric plate support members 6A–6D formed of a metal plate to support a dielectric plate to chamber lid 1 are fixed at chamber lid 1.

A substrate holder 7 that can hold a substrate 8 so as to face dielectric plates 5 is provided at chamber interior 12.

A gas supply tube 11 to supply reaction gas to chamber interior 12 from outside the chamber is connected to chamber lid 1. Each of dielectric plate support members 6A–6C includes a gas flow trench 6b and a gas introduction hole 6a to guide the reaction gas supplied through gas supply tube 11 to chamber interior 12.

Each of the plurality of gas introduction holes 6a has a tapered cross section with an opening diameter that gradually increases towards the outlet.

Referring mainly to FIG. 2, dielectric plate support members 6A and 6C are fixed to chamber lid 1 by a screw 30. This screw 30 passes through a fixed hole 6c of dielectric plate substrate members 6A and 6C to fit into a screw hole 1c of chamber lid 1. By fixing dielectric plate support members 6A and 6C to chamber lid 1, gas flow trench 6b is capped by chamber lid 1 to become a portion of the gas flow path. Accordingly, the reaction gas supplied from one gas supply tube 11 is branched at gas flow trench 6b to be introduced into chamber interior 12 from a plurality of gas introduction holes 6a. Each outlet of the plurality of gas introduction holes 6a opens at the side facing the surface of substrate 8.

Referring mainly to FIG. 3, six dielectric plates 5 are arranged in a matrix. The peripheral edge of each dielectric plate 5 is supported by dielectric plate support members 6A–6D. Accordingly, the outlet of gas introduction hole 6a is located at the peripheral region outer than dielectric plate 5.

A plurality of gas introduction holes 6a and fixed holes 6c (hole through which screw 30 passes) are arranged in three rows along the longitudinal direction of dielectric plate support member 6A. Fixed hole 6c is arranged only at the center row of the three rows.

A plurality of gas introduction holes 6a and fixed holes 6c are arranged in two rows in the longitudinal direction of dielectric plate support member 6B. Fixed hole 6c is arranged at only one of the two rows. Similar to dielectric plate support members 6A and 6C, dielectric plate support member 6B is fixed to chamber lid 1 by the insertion of screw 30 in fixed hole 6c. The plurality of gas introduction holes 6a at dielectric plate support member 6B are also branched from a gas flow trench 6b as shown in FIG. 1, and communicate with gas supply tube 11.

A plurality of gas introduction holes 6a and fixed holes 6c are arranged linearly in one row at dielectric plate support member 6C. Similar to dielectric plate support member 6A of FIG. 2, a plurality of gas introduction holes 6a of dielectric plate support member 6C are branched from gas flow trench 6b, and communicate with gas supply tube 11.

No gas introduction hole and fixed hole are provided at dielectric plate support member 6D.

Referring mainly to FIG. 1, dielectric plate support members 6A–6D, chamber lid 1 and process chamber unit 2 are formed of a conductor such as metal, and has a structure to which ground potential is applied. Bias voltage is applied to substrate 8.

The bias voltage applied to substrate 8 may be the RF bias as shown, or DC bias depending upon the process.

The surface of substrate 8 faces the surfaces of chamber lid 1, dielectric support members 6A–6D, and dielectric plate 5. The area of the metal portion (chamber lid 1 and dielectric plate support members 6A–6B) facing the surface of substrate 8 is greater than the area of the dielectric portion (dielectric plate 5), and occupies at least 50% of the plane facing substrate 8.

The diameter, cross sectional shape, and arrangement of gas introduction holes 6a can be easily altered. Since the flow of the process gas in chamber interior 12 changes depending upon the arrangement of the vacuum pump and the components in chamber interior 12, the plasma status may differ between the center region and the outer peripheral region of substrate 8. Therefore, the diameter and arrangement of gas introduction holes 6a are to be selected so that the entire plasma is uniform.

Dielectric plate support members 6A–6D is dispensable of the feature of supporting the dielectric plate. In this case, dielectric plate 5 must have the function to be secured to chamber lid 1.

The operation of the plasma process apparatus of the present embodiment employed as a dry etching apparatus will be described hereinafter.

Chambor interior 12 is maintained at a vacuum state by using a vacuum exhaust means in advance. The microwave (for example, 2.45 GHz in frequency) emitted from a magnetron (not shown) is guided by waveguide 3 through opening 3b waveguide end 3a and microwave introduction window 4 to be directed into chamber interior 12 from the surface of dielectric plate 5.

Process gas such as $CF_4$, $CHF_3$, and $O_2$ is introduced from gas supply tube 11 and branched at gas flow trench 6b to be supplied to chamber interior 12 from the outlet of the plurality of gas introduction holes 6a.

By introduction of the process gas in chamber interior 12, uniform plasma is generated by the microwave, whereby uniform etching is effected on a $SiO_2$ film or the like grown on substrate 8.

By changing the type of process gas and selecting a predetermined pressure of gas, other insulation films and metal films such as of Al can be etched.

In the present embodiment, ground potential is applied to chamber lid 1, process chamber unit 2 and dielectric plates support members 6A–6D whereas bias voltage is applied to substrate 8. Accordingly, the ions, excited particles, or electrons in the plasma generated at chamber interior 12 can be driven incident on the surface of substrate 8 substantially perpendicularly. In other words, the directivity of ions in the plasma process can be controlled favorably.

Dielectric plate 5 attains a floating potential since it functions as the transmission path of the microwave. If the area of dielectric plate 5 at the plane facing the surface of substrate 8 is larger than the area of the metal portion, the aforementioned effect of bias application cannot be achieved sufficiently.

In the present embodiment, the area of the metal portion (chamber lid 1 and dielectric plate support members 6A–6B) of the plane opposite to the surface of substrate 8 is at least 50%. Therefore, the aforementioned effect of bias application can be exhibited sufficiently. Ions and the like can be driven substantially perpendicular to the surface of substrate 8 in the plasma process. The ion incident energy can be controlled by adjusting the bias voltage. A plasma process of a wide control range such as the cross section shape of etching can be effected.

It is to be noted that plasma of sufficient high density can be generated even if the area of dielectric plate 5 is small. This is described in, for example, S. Morita et al., "Production of Low-Pressure Planar Non-Magnetized Plasmas Sustained under a Dielectric-Free Metal-Plasma Interface", Jpn. J. Appl. Phys. Vol. 37 (1998) pp. L 468–L470.

Dielectric plate 5 is divided into a plurality of portions. Therefore, it is not necessary to use one large dielectric plate even for the process of a substrate 8 of large area. Fabrication of dielectric plate 5 of the present invention is not difficult.

Such a small dielectric plate 5 can be easily obtained with a uniform medium using the existing fabrication facilities in comparison to the case where one large dielectric plate is formed. Thus, a dielectric plate 5 of uniform and superior medium can be obtained in comparison to the case where one large dielectric plate is formed.

According to the plasma process apparatus with such plurality of dielectric plates 5, damage, if any, of a portion of dielectric plate 5 can be easily and promptly repaired by replacing just the damaged dielectric plate 5. As a result, the labor and time required for the maintenance of the plasma process apparatus can be reduced.

The present embodiment is implemented so that reaction gas is supplied from the surroundings of each of the divided plurality of dielectric plates 5. Therefore, reaction gas can be supplied evenly from the perimeter of dielectric plate 5 even in the case where a substrate 8 of large area is processed to realize a uniform plasma.

In the region between one and the other of dielectric plates 5 adjacent to each other as shown in FIG. 1, a plurality of gas introduction holes 6a are arranged in a direction from one dielectric plate 5 to the other dielectric plate 5. Therefore, reaction gas can be supplied in a more uniform manner into chamber interior 12.

Gas introduction hole 6a has a tapered cross section with an opening diameter gradually increased towards the outlet. Therefore, the reaction gas emitted from gas introduction hole 6a into chamber interior 12 can be directed obliquely as well as perpendicularly towards the bottom of dielectric plate support members 6A–6C. As a result, the distribution of the reaction gas can be set more uniformly at chamber interior 12. The plasma process can be carried out at a more uniform condition.

Dielectric plate 5 is formed of ceramics with AlN as the main component. AlN has superior heat condition. In the case where dielectric plate 5 is heated locally by the plasma formed at chamber interior 12, the heat applied locally can be promptly transmitted over the entirety of dielectric plate 5. As a result, dielectric plate 5 can be prevented from being damaged by this local heating.

When a partially high temperature portion is generated in chamber interior 12, the heat of the high temperature area can be transmitted promptly to another region by using a material superior in heat condition for dielectric plate 5. Therefore, the ambient temperature of chamber interior 12 can be readily set uniform.

The microwave transmission means including waveguide 3, waveguide end 3a and microwave introduction window 4 has a single mode microwave guide path. Therefore, the microwave can be easily controlled and transmitted to chamber interior 12 stably and uniformly.

Second Embodiment

Figure 4:
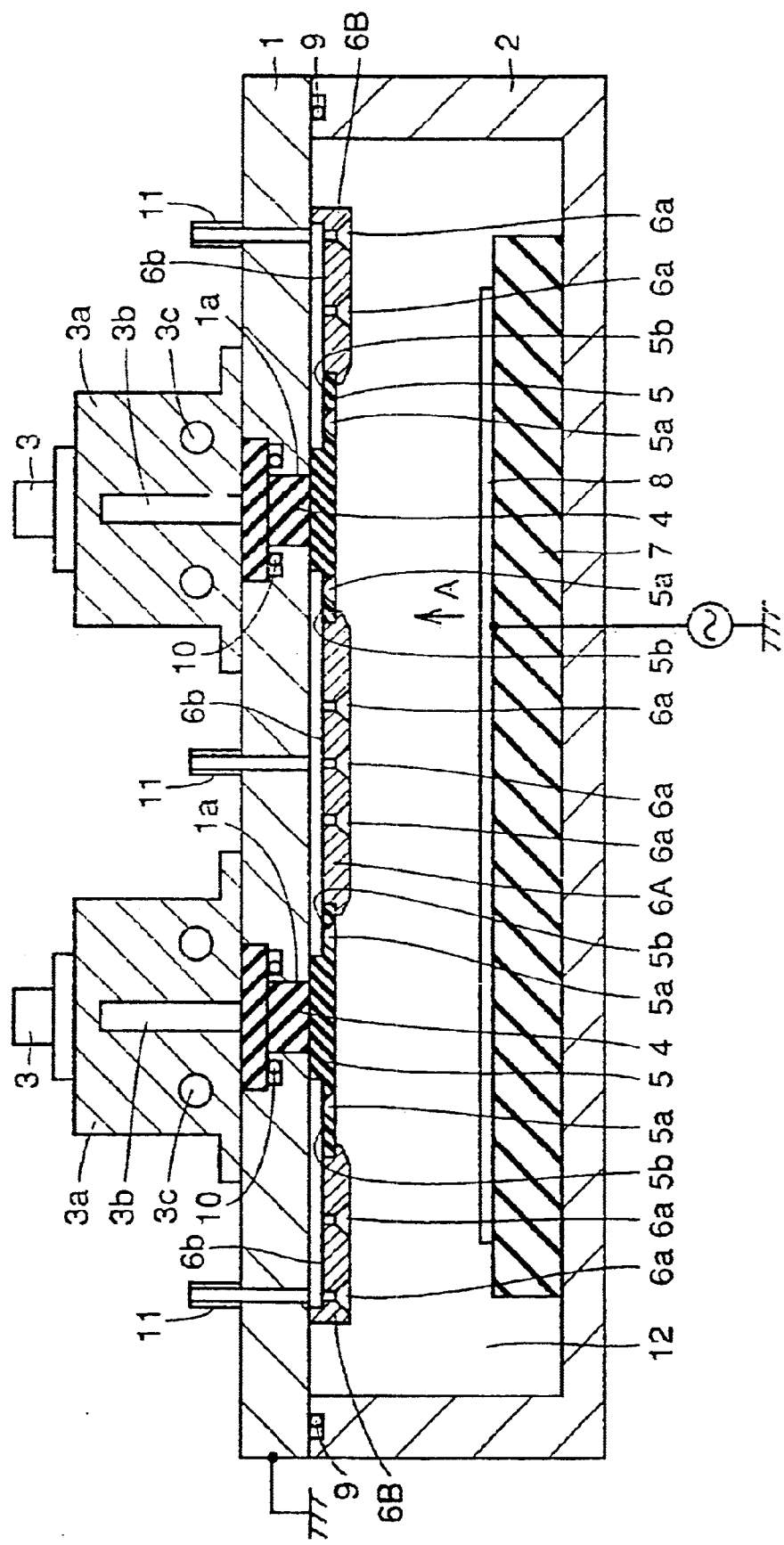
FIG. 4 is a schematic sectional view of a plasma process apparatus according to a second embodiment of the present invention.

FIG. 4 corresponds to the cross section taken along line IV—IV of FIG.

Referring mainly to FIG. 4, the structure of a plasma process apparatus according to a second embodiment of the present invention differs from the structure of the plasma process apparatus of the first embodiment in the provision of a gas introduction hole 5a and a gas flow trench 5b in dielectric plate 5.

Gas flow trench 5b of dielectric plate 5 is connected to gas flow trench 6b of any of dielectric plate support members 6A–6C, and communicates with gas supply tube 11. Gas supply hole 5a of dielectric plate 5 branches from gas flow trench 5b, and is opened to face the surface of substrate 8. Gas introduction hole 5a has a tapered cross section with an opening diameter increasing towards the outlet.

Figure 5:
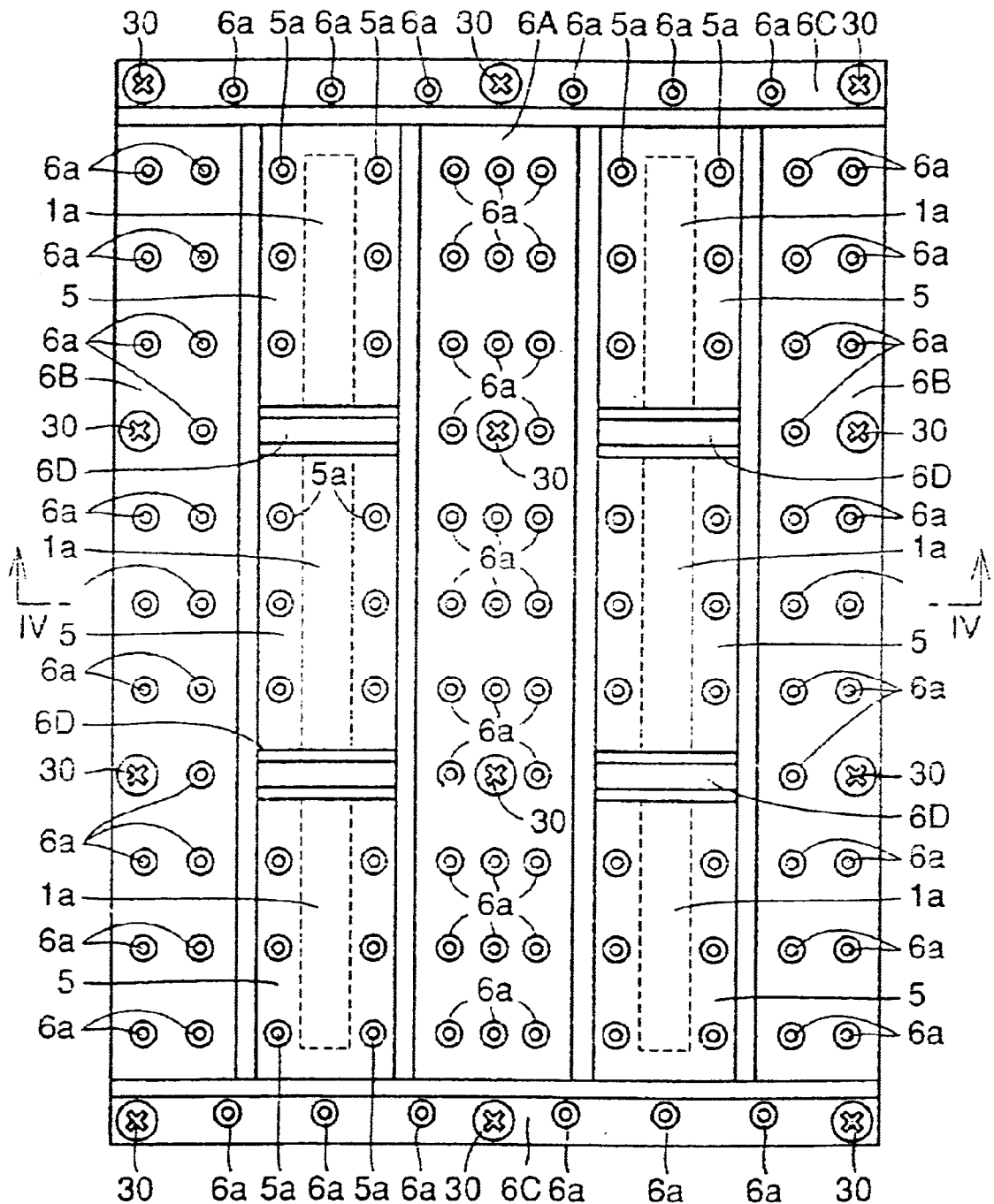
FIG. 5 shows an arrangement of dielectric plates and dielectric plate support members viewed from the direction of arrow A of FIG. 4.
Figure 6:
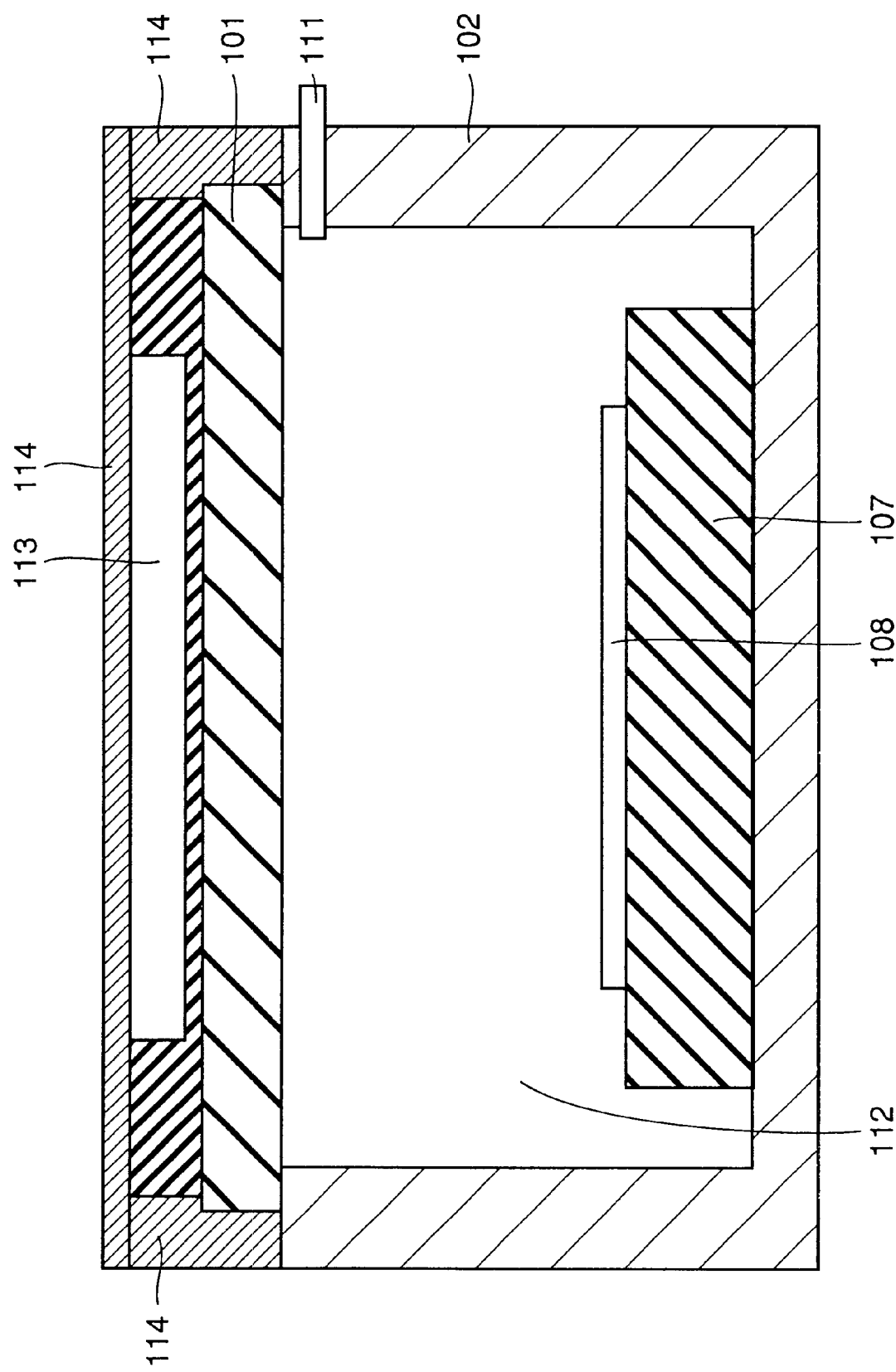
FIG. 6 is a schematic sectional view of a conventional plasma process apparatus.
Figure 7:
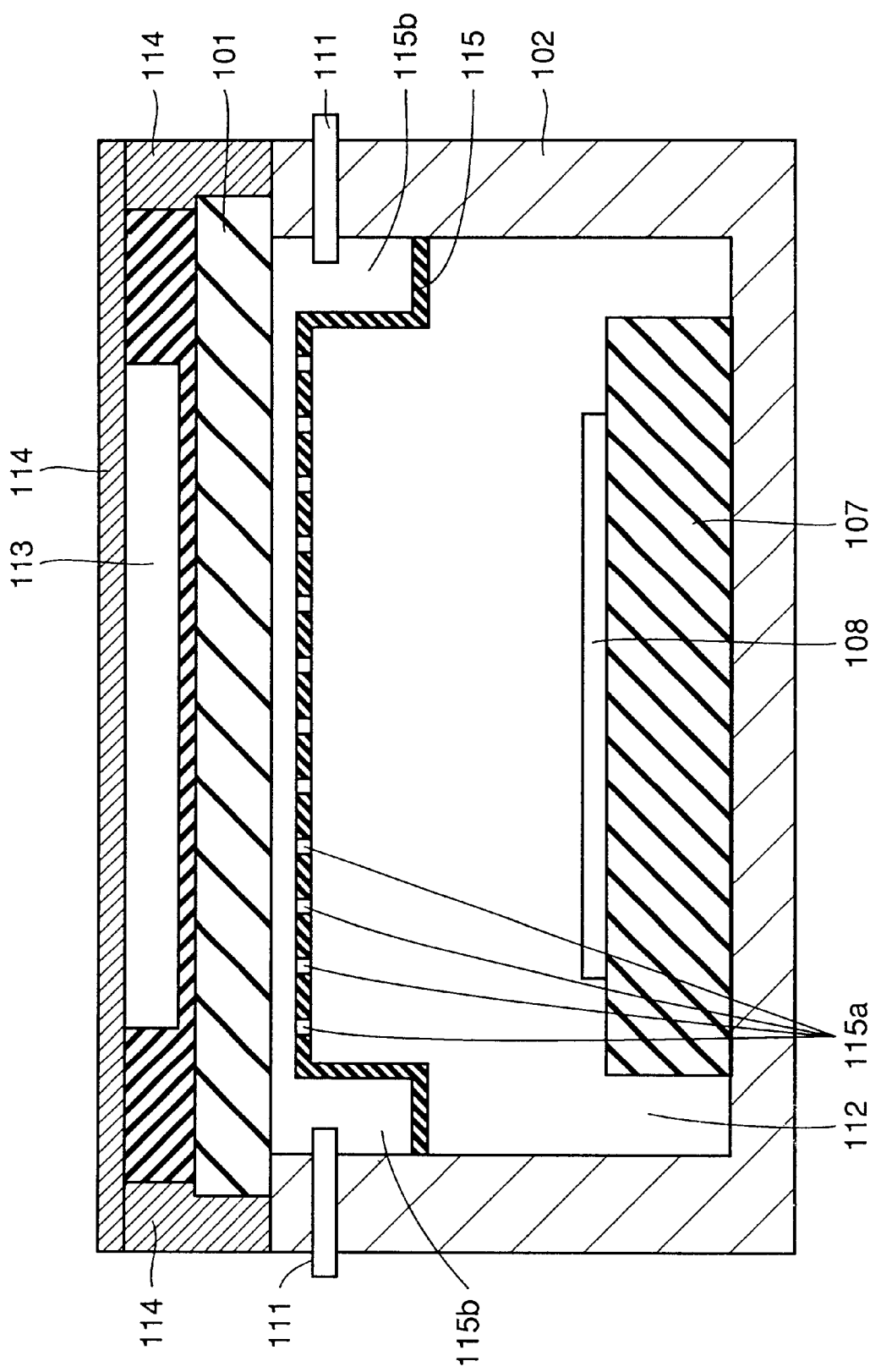
FIG. 7 is a schematic sectional view of a conventional plasma process apparatus employing a showerhead.
Figure 8:
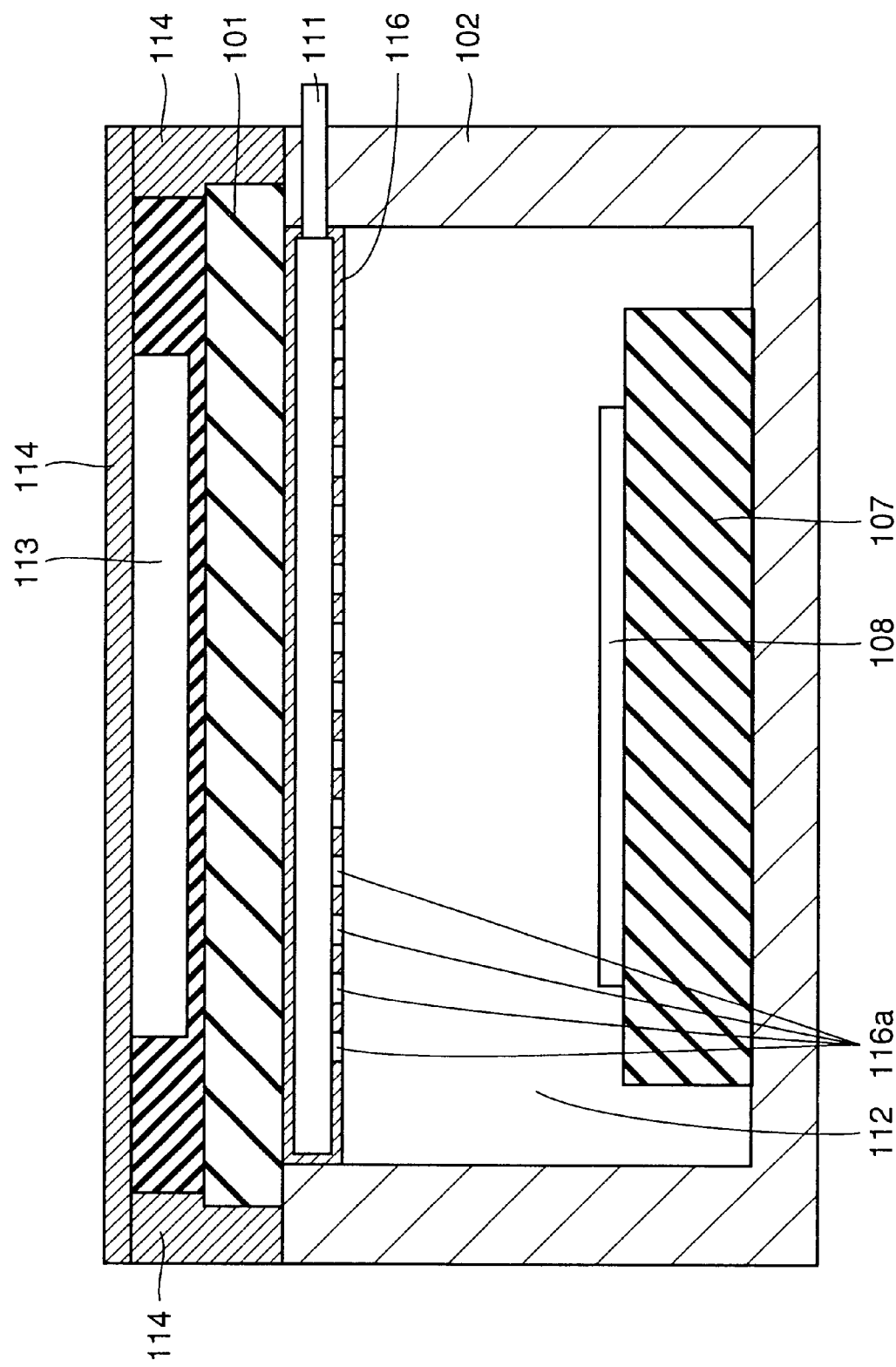
FIG. 8 is a schematic sectional view of a conventional plasma process apparatus employing a metal plate.
Figure 9:
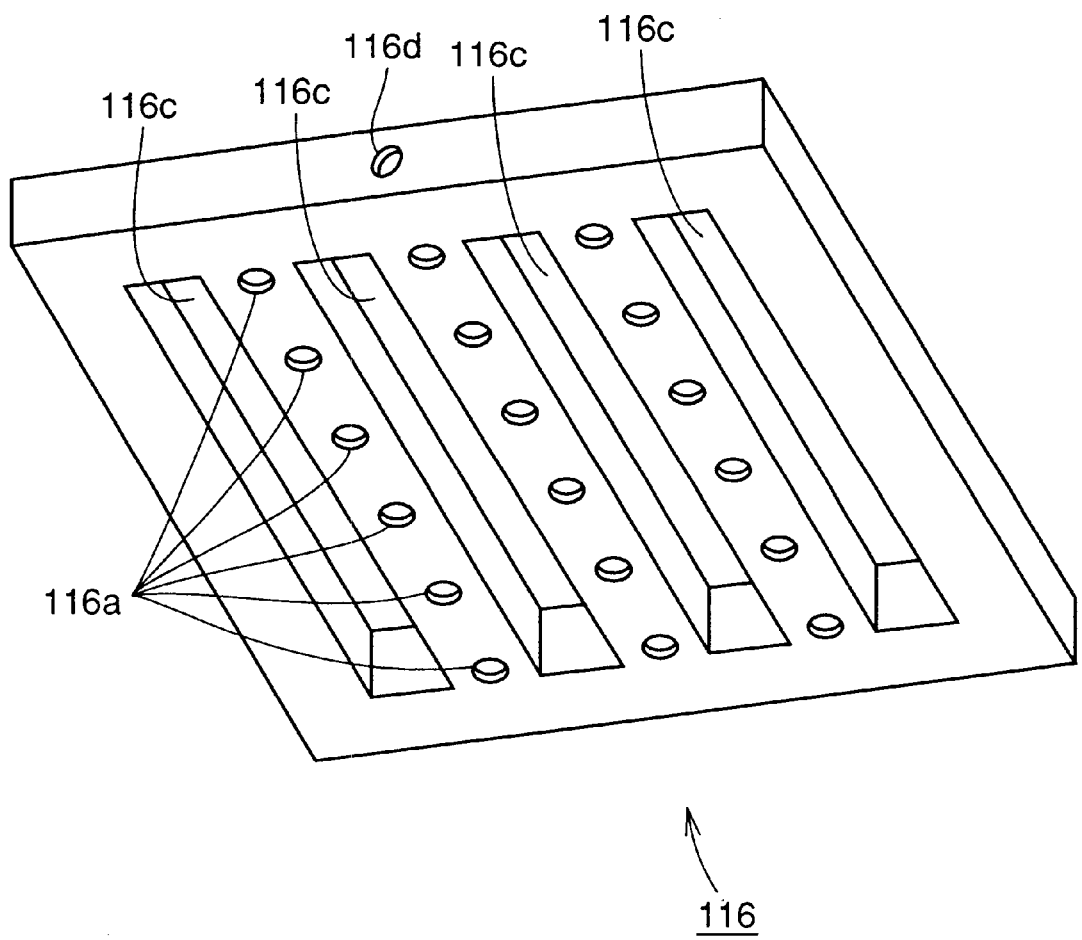
FIG. 9 is a oblique view of a metal plate.

Referring mainly to FIG. 5, gas introduction hole 5a is arranged at an outer peripheral region of dielectric plate 5.

The remaining structure is similar to that of the previous first embodiment. The same components have the same reference characters allotted, and description thereof will not be repeated.

Since a gas introduction hole 5a is provided additionally at the outer peripheral region of dielectric plate 5 in the present embodiment, the total number of gas introduction holes is greater than that of the first embodiment. Therefore, reaction gas can be supplied more uniformly into chamber interior 12.

The structure of the plasma process apparatus of the present invention is not limited to the structure where substrate 8 is placed horizontally as shown in the first and second embodiments. Substrate 8 may be arranged perpendicularly or obliquely.

The plasma process apparatus of the present invention is applied to a dry etching device in the first and second embodiments. The present invention is not limited to a dry etching apparatus, and is applicable to a CVD apparatus or ashing apparatus, for example.

The plasma process apparatus of the present invention can process a substrate of a large area uniformly and at low cost using a uniform plasma.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma process apparatus for processing a surface of a substrate using a reaction gas converted to a plasma by microwaves, said plasma process apparatus comprising:
   a processing chamber in which said substrate can be supported,
   microwave transmission means for transmitting microwaves,
   a plurality of dielectric plates arranged in a matrix, having a main surface facing the surface of said substrate, and emitting microwaves transmitted by said microwave transmission means from the main surface into said processing chamber, wherein the matrix is a two-dimensional rectangular arrangement of rows and columns of said dielectric plates, and
   a plurality of reaction gas supply paths to supply reaction gas to said processing chamber,
   wherein each of said plurality of reaction gas supply paths includes a reaction gas outlet having an opening at a side facing and parallel to the surface of said substrate, and a plurality of said reaction gas outlets are arranged in a metal portion at a peripheral region of the main surface of said matrix of dielectric plates, said metal portion arranged to hold said matrix of dielectric plates,
   wherein ground potential is applied to said processing chamber and bias voltage is applied to said substrate.

2. The plasma process apparatus according to claim 1, wherein an area of a metal member, including said metal portion in which said reaction gas outlets are arranged at an inner wall of said processing chamber facing the surface of said substrate is at least 50%.

3. The plasma process apparatus according to claim 1, wherein an outlet for a dielectric plate communicating with said reaction gas supply path is provided at said dielectric plate.

4. The plasma process apparatus according to claim 1, wherein, at a region sandwiched by one dielectric plate and another dielectric plate adjacent to each other among said plurality of dielectric plates, a plurality of said reaction gas outlets are arranged along a direction from said one dielectric plate to said an other dielectric plate.

5. The plasma process apparatus according to claim 1, wherein each of said plurality of reaction gas supply paths has an opening at a surface facing the surface of the substrate and facing the same direction and facing a direction perpendicular to the surface of the dielectric plates.

6. The plasma process apparatus according to claim 1, wherein said processing chamber has a chamber lid facing the surface of the substrate, a member including the reaction gas outlet being formed of a member different from said chamber lid.

7. The plasma process apparatus according to claim 1, wherein each of said plurality of reaction gas supply paths includes a reaction gas outlet of a tapered configuration.

* * * * *